(12) United States Patent
Zhang et al.

(10) Patent No.: US 11,436,949 B2
(45) Date of Patent: Sep. 6, 2022

(54) OLED DISPLAY APPARATUS INCLUDING FLEXIBLE SUBSTRATE HAVING INSULATION LAYER WITH AN INCLINED TOP SURFACE

(71) Applicant: BOE Technology Group Co., Ltd., Beijing (CN)

(72) Inventors: Huijuan Zhang, Beijing (CN); Shantao Chen, Beijing (CN); Fangxu Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/914,499

(22) Filed: Jun. 29, 2020

(65) Prior Publication Data
US 2021/0065588 A1 Mar. 4, 2021

(30) Foreign Application Priority Data
Aug. 30, 2019 (CN) .......................... 201910815380.7

(51) Int. Cl.
*G09F 9/30* (2006.01)
*H01L 27/32* (2006.01)
*H01L 51/00* (2006.01)
*H01L 51/56* (2006.01)

(52) U.S. Cl.
CPC .......... *G09F 9/301* (2013.01); *H01L 27/3262* (2013.01); *H01L 51/0097* (2013.01); *H01L 51/56* (2013.01); *H01L 2251/5338* (2013.01)

(58) Field of Classification Search
CPC . G09F 9/301; H01L 27/3262; H01L 51/0097; H01L 51/56

USPC .......................................................... 257/40
See application file for complete search history.

(56) References Cited

U.S. PATENT DOCUMENTS

| | | | |
|---|---|---|---|
| 2013/0099258 A1 | 4/2013 | Lim et al. | |
| 2014/0312319 A1* | 10/2014 | Kim .................... | H01L 27/3258 257/40 |
| 2015/0001477 A1* | 1/2015 | Namkung ........... | H01L 27/3258 257/40 |
| 2016/0226013 A1 | 8/2016 | Liu et al. | |
| 2019/0165052 A1* | 5/2019 | Son ..................... | H01L 51/5262 |

(Continued)

FOREIGN PATENT DOCUMENTS

| CN | 104282721 A | 1/2015 |
|---|---|---|
| CN | 108461526 A | 8/2018 |
| CN | 109935730 A | 6/2019 |

(Continued)

OTHER PUBLICATIONS

Office Action dated May 12, 2021 for Chinese Patent Application No. 201910815380.7 and English Translation.

(Continued)

*Primary Examiner* — Matthew E. Gordon
(74) *Attorney, Agent, or Firm* — Ling Wu; Stephen Yang; Ling and Yang Intellectual Property

(57) ABSTRACT

The present disclosure provides a display substrate, a preparation method thereof and a display apparatus. The display substrate includes a flexible substrate and a compensation layer arranged on the flexible substrate, wherein an OLED pixel is arranged on the compensation layer, a surface of the compensation layer facing the OLED pixel being an inclined surface with respect to the flexible substrate.

14 Claims, 10 Drawing Sheets

(56) References Cited

U.S. PATENT DOCUMENTS

| | | |
|---|---|---|
| 2019/0181365 A1 | 6/2019 | Choi |
| 2021/0257434 A1 | 8/2021 | Xie et al. |

FOREIGN PATENT DOCUMENTS

| | | |
|---|---|---|
| CN | 110010646 A | 7/2019 |
| CN | 110034154 A | 7/2019 |
| CN | 110164952 A | 8/2019 |

OTHER PUBLICATIONS

Office Action dated Aug. 9, 2021 for Chinese Patent Application No. 201910815380.7 and English Translation.

\* cited by examiner

OLED DISPLAY APPARATUS INCLUDING FLEXIBLE SUBSTRATE HAVING INSULATION LAYER WITH AN INCLINED TOP SURFACE

CROSS REFERENCE TO RELATED APPLICATION

This application claims the priority of Chinese Patent Application No. 201910815380.7 filed to the CNIPA on Aug. 30, 2019, the entire content of which is hereby incorporated by reference.

TECHNICAL FIELD

The present disclosure relates to, but is not limited to, the field of display technologies, in particular to a display substrate and a preparation method thereof, and a display apparatus.

BACKGROUND

An Organic Light-Emitting Diode (OLED) display is a display and lighting technology developed in recent years and is considered to have a wide application prospect due to its advantages of high response, high contrast and flexibility, etc. In an aspect of flexible display, deformable and bendable characteristics of OLED display device further reflect the advantages of the OLED display.

As one of the important development directions of flexible display products, a stretchable display device has attracted more and more attentions. In an existing stretchable OLED product, a stretchable display substrate includes a display island area, a connection bridge area and an opening area, an OLED pixel is arranged in the display island area, a trace between adjacent display island areas are arranged in the connection bridge area, and the opening area is provided with openings to bear tensile strain. The manufacturing process of components (such as thin film transistors and OLED light emitting devices) on the stretchable display substrate with openings is similar to that of the related art.

In actual use, it is found that for an existing stretchable display panel, an optical display abnormality in a stretched state is easy to occur.

SUMMARY

The following is a summary of the subject matter described in detail herein. This summary is not intended to limit the protection scope of the claims.

In one aspect, an embodiment of the present disclosure provides a display substrate, including a flexible substrate and a compensation layer arranged on the flexible substrate, wherein an OLED pixel is arranged on the compensation layer, a surface of the compensation layer facing the OLED pixel being an inclined surface with respect to the flexible substrate.

In some possible implementations, an angle between the surface of the compensation layer facing the OLED pixel and the flexible substrate is 5 degrees to 10 degrees.

In some possible implementations, the display substrate includes the flexible substrate, a driving structure layer arranged on the flexible substrate, and a first insulating layer arranged on the driving structure layer, wherein the OLED pixel includes a first electrode arranged on the first insulating layer, the compensation layer including the first insulating layer, a surface of the first insulating layer facing the OLED pixel being an inclined surface with respect to the flexible substrate.

In some possible implementations, material of the first insulating layer is an organic material.

In some possible implementations, a thickness of the thickest position of the first insulating layer is 2.5 μm to 3.5 μm, and a thickness of the thinnest position of the first insulating layer is 0.8 μm to 1.5 μm.

In some possible implementations, the display substrate includes the flexible substrate, a driving structure layer arranged on the flexible substrate, and a first insulating layer arranged on the driving structure layer, wherein the OLED pixel includes a first electrode arranged on the first insulating layer, the compensation layer including the first electrode, a surface of the first electrode facing the OLED pixel being an inclined surface with respect to the flexible substrate.

In some possible implementations, the display substrate includes the flexible substrate, a driving structure layer arranged on the flexible substrate, and a first insulating layer arranged on the driving structure layer, wherein the OLED pixel includes a first electrode arranged on the first insulating layer, the driving structure layer including a thin film transistor and second and third insulating layers arranged between adjacent layers of the thin film transistor, the compensation layer including the second insulating layer, a surface of the second insulating layer facing the OLED pixel being an inclined surface with respect to the flexible substrate.

In some possible implementations, the display substrate includes the flexible substrate, a driving structure layer arranged on the flexible substrate, and a first insulating layer arranged on the driving structure layer, wherein the OLED pixel includes a first electrode arranged on the first insulating layer, the driving structure layer including a thin film transistor and a second and a third insulating layers arranged between adjacent layers of the thin film transistor, the compensation layer including the third insulating layer, a surface of the third insulating layer facing the OLED pixel being an inclined surface with respect to the flexible substrate.

In some possible implementations, the display substrate includes the flexible substrate, a buffer layer arranged on the flexible substrate, a driving structure layer arranged on the buffer layer, and a first insulating layer arranged on the driving structure layer, wherein the OLED pixel includes a first electrode arranged on the first insulating layer, the compensation layer including the buffer layer, a surface of the buffer layer facing the OLED pixel being an inclined surface with respect to the flexible substrate.

In another aspect, an embodiment of the present disclosure further provides a method for preparing a display substrate panel, including: forming a driving structure layer on a flexible substrate; forming a first insulating film on the driving structure layer; exposing and developing a first insulating film by adopting a gray mask plate to form a first insulating layer, wherein a surface of the first insulating layer facing the OLED pixel is an inclined surface with respect to the flexible substrate; and forming an OLED pixel on the first insulating layer.

In another aspect, an embodiment of the present disclosure further provides a display apparatus, including a display substrate, wherein the display substrate includes a flexible substrate and a compensation layer arranged on the flexible substrate; an OLED pixel being arranged on the compensation layer; a surface of the compensation layer facing the OLED pixels being an inclined surface with respect to the flexible substrate.

In some possible implementations, an angle between the surface of the compensation layer facing the OLED pixel and the flexible substrate is 5 degrees to 10 degrees.

In some possible implementations, the display substrate includes the flexible substrate, a driving structure layer arranged on the flexible substrate, and a first insulating layer arranged on the driving structure layer, wherein the OLED pixel includes a first electrode arranged on the first insulating layer, the compensation layer including the first insulating layer, a surface of the first insulating layer facing the OLED pixel being an inclined surface with respect to the flexible substrate.

Other features and advantages of technical solutions of the present disclosure will be set forth in the description which follows, and in part will become apparent from the description, or be learned by practice of the technical solutions of the present disclosure. Purposes and other advantages of the technical solutions of the present disclosure may be realized and obtained by structures specifically pointed out in the specification, claims and drawings.

BRIEF DESCRIPTION OF DRAWINGS

Accompanying drawings are used to provide a further understanding of technical solutions of the present disclosure, form a part of the specification, and explain technical solutions of the present disclosure together with embodiments of the present disclosure, while they do not constitute a limitation on the technical solutions of the present disclosure.

DETAILED DESCRIPTION

In order to make purposes, technical solutions and advantages of the present disclosure clearer, embodiments of the present disclosure will be described in detail below with reference to the accompanying drawings. Those skilled in the art should understand that embodiments in the present disclosure and features in the embodiments may be combined with each other arbitrarily if there is no conflict.

Those skilled in the art can understand that a light emitting direction of a display substrate is perpendicular to a light emitting surface of an OLED pixel, which means that the light emitting direction is a direction perpendicular to the light emitting surface of the pixel.

Figure 1:
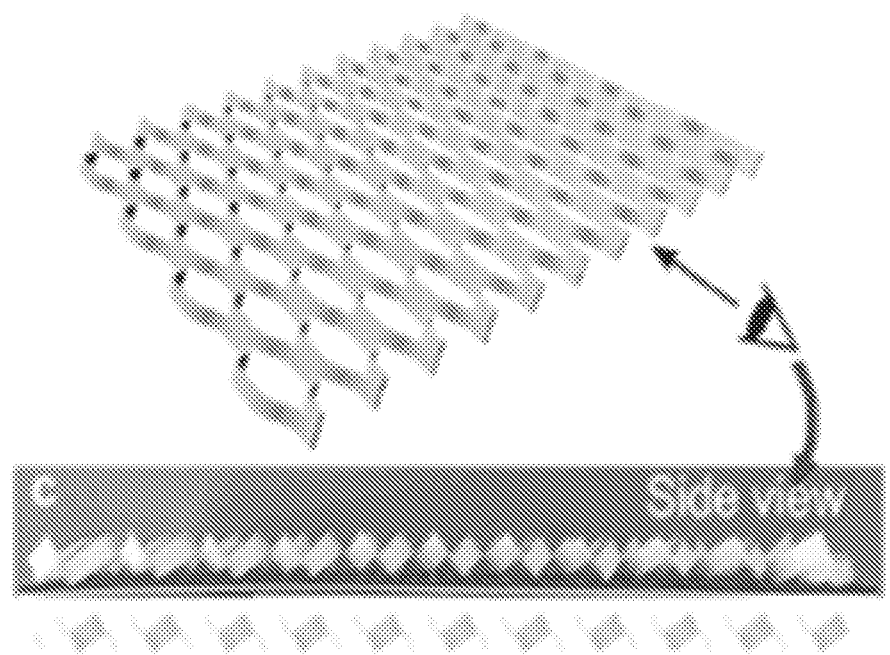
FIG. 1 is a schematic view of a stretchable display substrate vertically turned over.
Figure 2A:
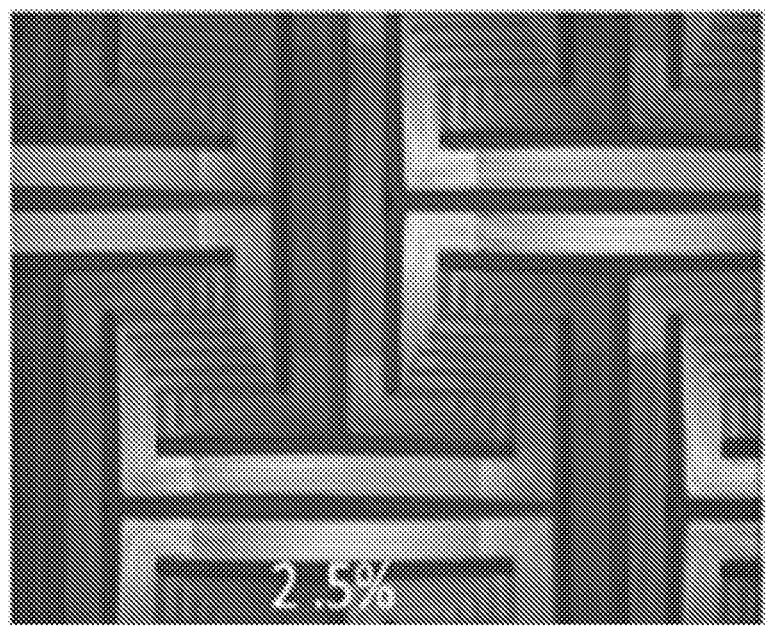
FIGS. 2a to 2d are schematic diagrams for comparing micrographs of the stretchable display substrate with 工-shaped openings after being vertically turned over.
Figure 2B:
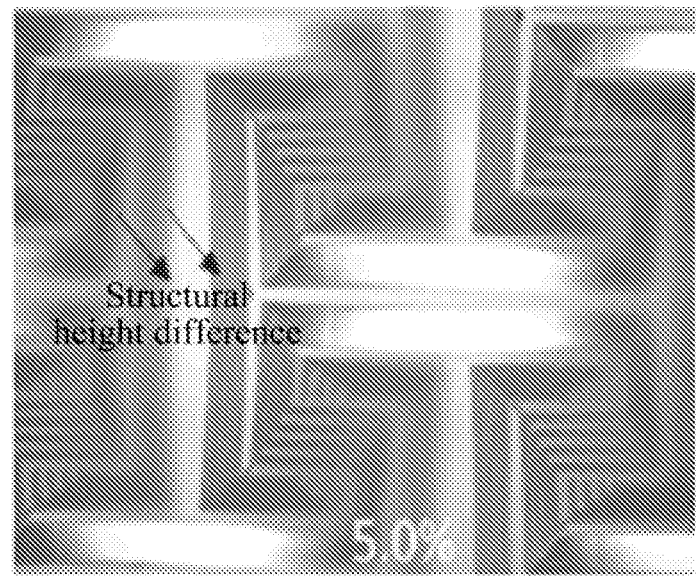
Figure 2C:
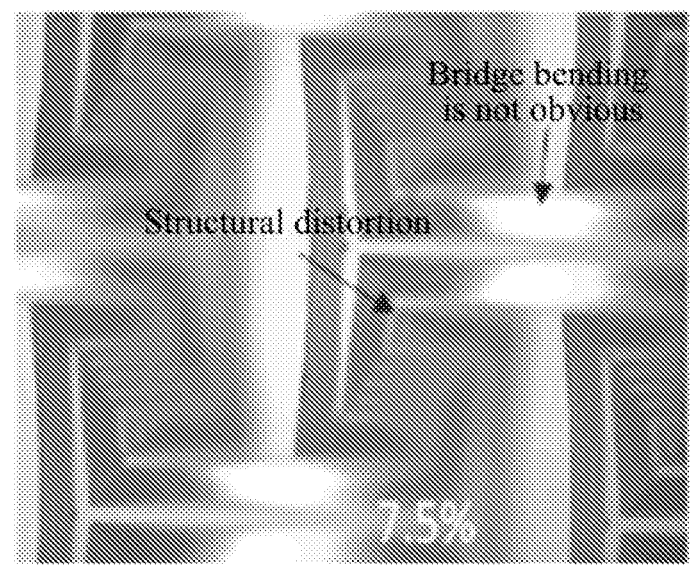
Figure 2D:
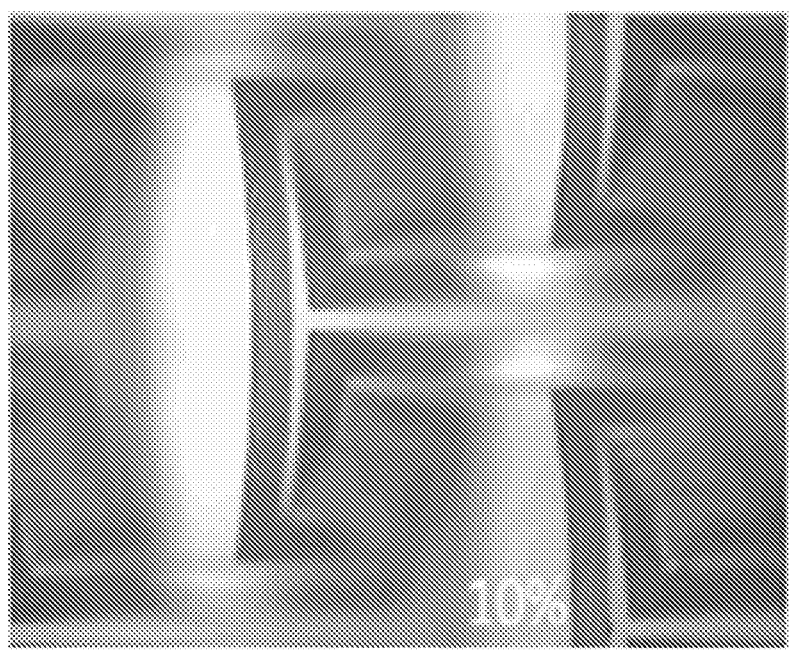

A stretchable display substrate includes a display island area, a connection bridge area and an opening area, an OLED pixel is arranged in the display island area, a trace between adjacent display island areas is arranged in the connection bridge area, and an opening area is provided with openings to bear tensile strain. Due to a large size difference between a width and a thickness of the connection bridge area, the display island area is easy to turn over vertically after the OLED display substrate is stretched, as shown in FIG. 1. FIG. 1 is a schematic diagram of a vertical turning over of the stretchable display substrate. In FIG. 1, when the stretchable display substrate is stretched, when viewing from a side of the display substrate, the display island area turns over vertically (i.e., turns counterclockwise). FIGS. 2a to 2d are schematic diagrams for comparing micrographs of the stretchable display substrate with 工-shaped openings after being vertically turned over. From FIGS. 2a to 2d, the stretching amounts of the display substrate are 2.5%, 5.0%, 7.5% and 10% respectively. As shown in FIGS. 2a to 2d, after the stretchable display substrate is vertically turned over, a light emitting direction of the display substrate is affected to be changed, resulting in an optical display abnormality. Moreover, the greater the amount of stretching, the more serious the vertical turning over is, the greater the influence on the light emitting direction is, and the more serious the display abnormality is.

Figure 3A:
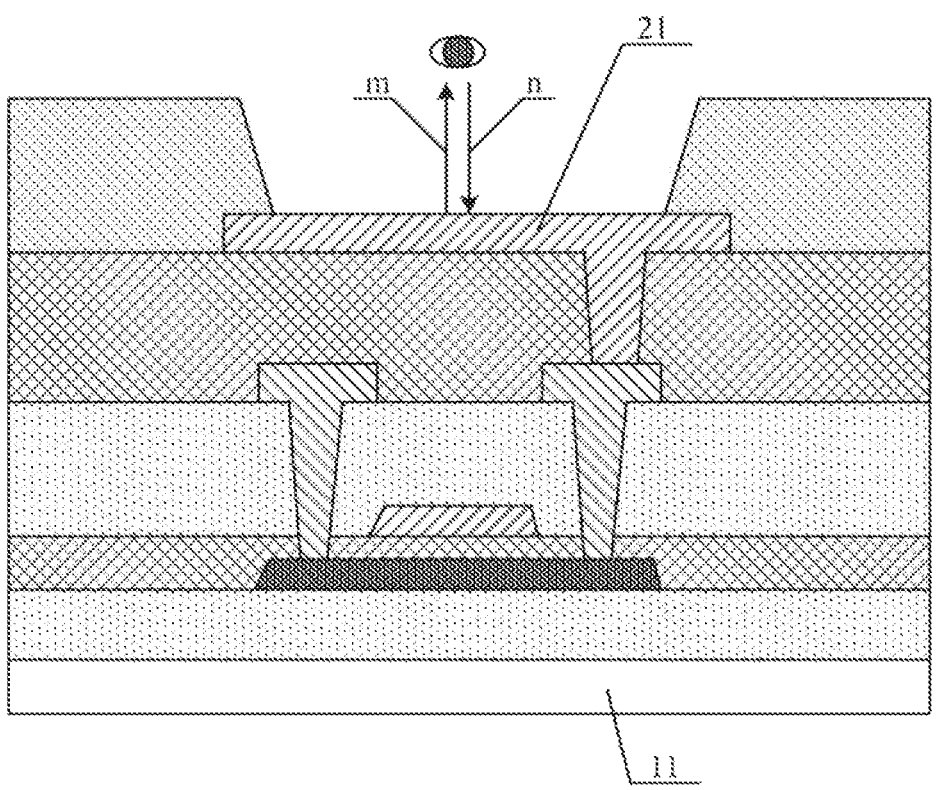
FIG. 3a is a schematic diagram of a stretchable display substrate before the stretchable display substrate is stretched.
Figure 3B:
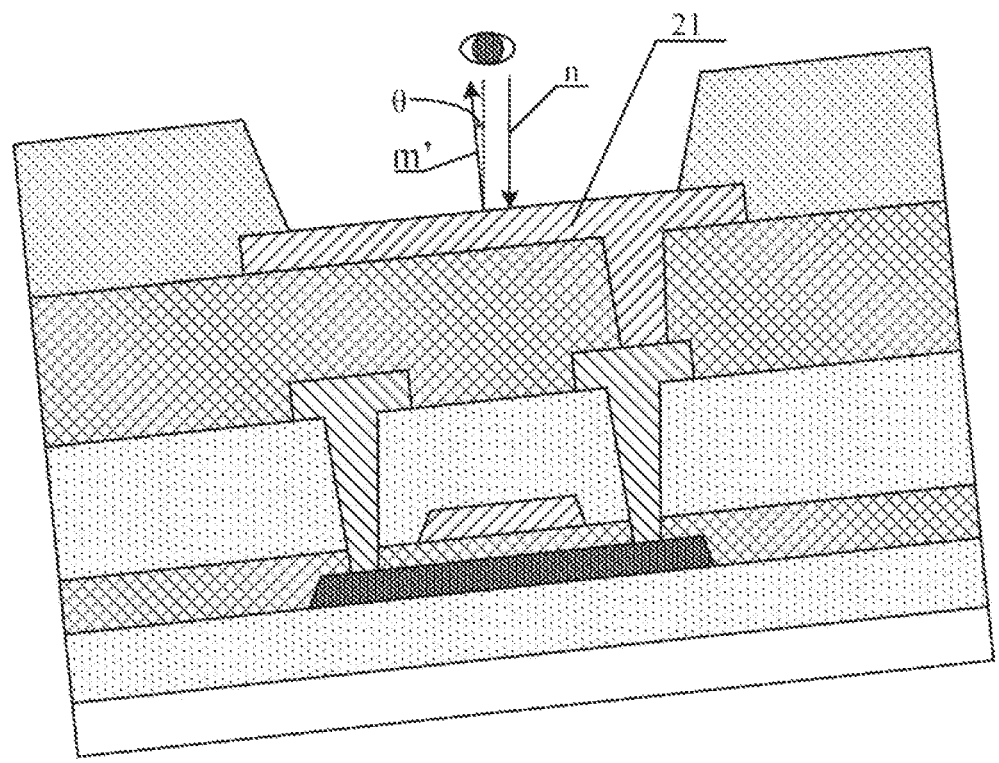
FIG. 3b is a schematic diagram of the stretchable display substrate shown in FIG. 3a after the stretchable display substrate is stretched.

FIG. 3a is a schematic diagram of a stretchable display substrate before the stretchable display substrate is stretched, and FIG. 3b is a schematic diagram of the stretchable display substrate shown in FIG. 3a after the stretchable display substrate is stretched. The stretchable display substrate includes a display island area, a connection bridge area and an opening area, an OLED pixel is arranged in the display island area, a trace between adjacent display island regions is arranged in the connection bridge area, and the opening area is provided with openings to bear tensile strain. One OLED pixel of the display island area is shown in FIG. 3a (only a first electrode 21 (the first electrode is usually an anode) of the OLED pixel is shown in the figure). Those skilled in the art may understand that after other film layers of the OLED pixel are formed on the first electrode 21, a light emitting surface of the OLED pixel is parallel to an upper surface of the first electrode 21. Therefore, in the unstretched state shown in FIG. 3a, the light emitting surface of the OLED pixel is in a horizontal state, thus, the light emitting direction of the display substrate is m, and m is a vertical direction. In FIG. 3a, a viewing direction of a viewer is a vertical direction n, and the light emitting direction m of the display substrate is consistent with the viewing direction n of the viewer.

Those skilled in the art may understand that the display of the stretchable display substrate in the stretched state is a use state of the stretchable display substrate. As shown in FIG. 3b, after the display substrate is stretched (in the use state), the display island area is vertically turned over, so that the light emitting surface of the OLED pixel is no longer horizontal, and the light emitting direction of the display substrate is changed from m to m', and an angle θ is formed between m' and m. However, in FIG. 3b, the viewing direction of the viewer is still the vertical direction n, the light emitting direction m' of the display substrate is inconsistent with the viewing direction n, and there is a certain angle deviation between the light emitting direction m' and the viewing direction n. The angle deviation between the light emitting direction m' and the viewing direction n will lead to an optical display abnormality of the display substrate, and the more serious the vertical turnover of the display substrate is, the greater the angle deviation between the light emitting direction m' and the viewing direction n is, the more serious the optical display abnormality is.

In order to solve the above technical problems, an embodiment of the present disclosure provides a display substrate. The display substrate includes a flexible substrate and a compensation layer arranged on the flexible substrate, wherein an OLED pixel is arranged on the compensation layer, a surface of the compensation layer facing the OLED pixel being an inclined surface with respect to the flexible substrate.

Figure 4:
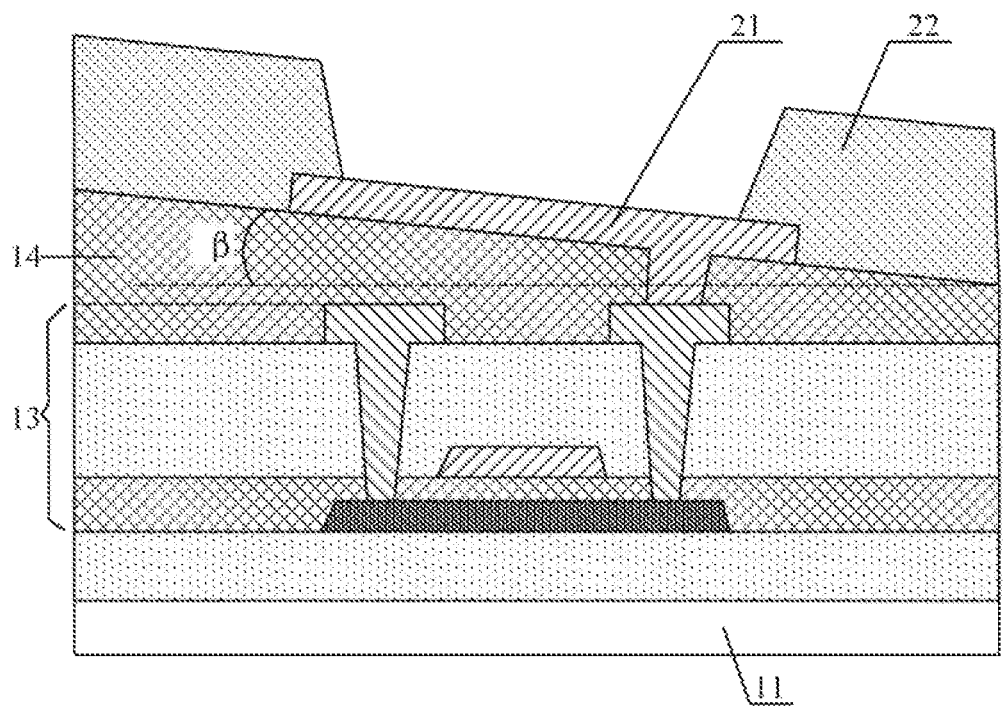
FIG. 4 is a schematic diagram of a structure of a display substrate in an exemplary embodiment of the present disclosure.

FIG. 4 is a schematic diagram of a structure of a display substrate in an exemplary embodiment of the present disclosure, and FIG. 4 shows a state of the display substrate before the display substrate is stretched. As shown in FIG. 4, the display substrate is a stretchable display substrate, and the display substrate includes a display island area, a connection bridge area, and an opening area. An OLED pixel is arranged in the display island region. In a pixel region, the display substrate includes a flexible substrate 11 and a compensation layer arranged on the flexible substrate 11. The OLED pixel is arranged on the compensation layer. A surface (upper surface) of the compensation layer facing the OLED pixel (upper side) is an inclined surface with respect to the flexible substrate 11.

Figure 5:
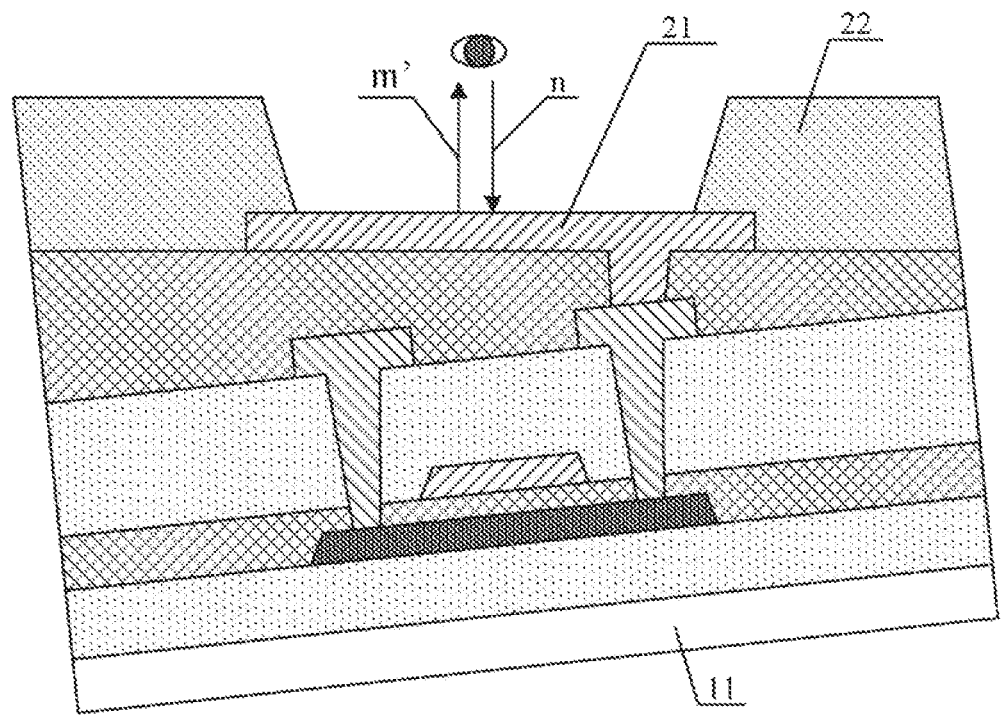
FIG. 5 is a schematic diagram of the display substrate shown in FIG. 4 in a stretched state.

FIG. 5 is a schematic diagram of the display substrate shown in FIG. 4 in a stretched state. As shown in FIG. 5, when the display substrate is stretched, the display island area is vertically turned over (counterclockwise with respect to FIG. 4). Since the surface of the compensation layer facing the OLED pixel (upper side) is an inclined surface with respect to the flexible substrate 11, the light emitting surface of the OLED pixel is also an inclined surface with respect to the flexible substrate 11, so that when the OLED pixel is vertically turned over along with the display island area, the light emitting surface of the OLED pixel is also vertically turned over to approach the horizontal state, which makes the light emitting direction m' of the display substrate approach the vertical direction, so that the light emitting direction is consistent with the viewing direction n of the viewer, thus avoiding an optical display abnormality of the display substrate in the stretched state and improving a display performance of the stretchable display substrate in the stretched state.

Figure 6:
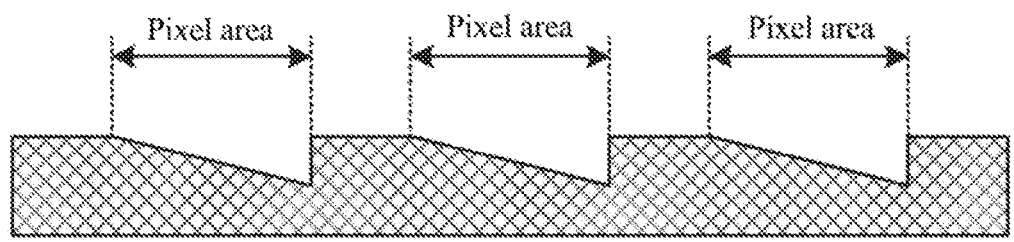
FIG. 6 is a schematic diagram of a shape of an upper surface of an overall compensation layer.

Those skilled in the art may understand that the upper surface of the compensation layer described herein is an inclined surface with respect to the flexible substrate 11, which means that in the pixel area, the upper surface of the compensation layer is an inclined surface with respect to the flexible substrate 11. If viewed from an entire display substrate, the upper surface of the compensation layer has a teeth shape, as shown in FIG. 6, which is a schematic diagram of a shape of the upper surface of the entire compensation layer, and the teeth shape corresponds to the pixel area.

As shown in FIGS. 4 and 5, in the embodiment, after the display substrate is stretched, the display island area is turned over counterclockwise, so that the surface of the compensation layer facing the OLED pixel is an inclined surface from left to right downward (i.e., the upper surface of the compensation layer gradually approaches the flexible substrate 11 from left to right). Those skilled in the art may understand that in other embodiments, when the display island area is turned over clockwise after the display substrate is stretched, the surface of the compensation layer facing the OLED pixel needs to be inclined from right to left downward (i.e., the upper surface of the compensation layer gradually approaches the flexible substrate 11 from right to left).

Figure 7:
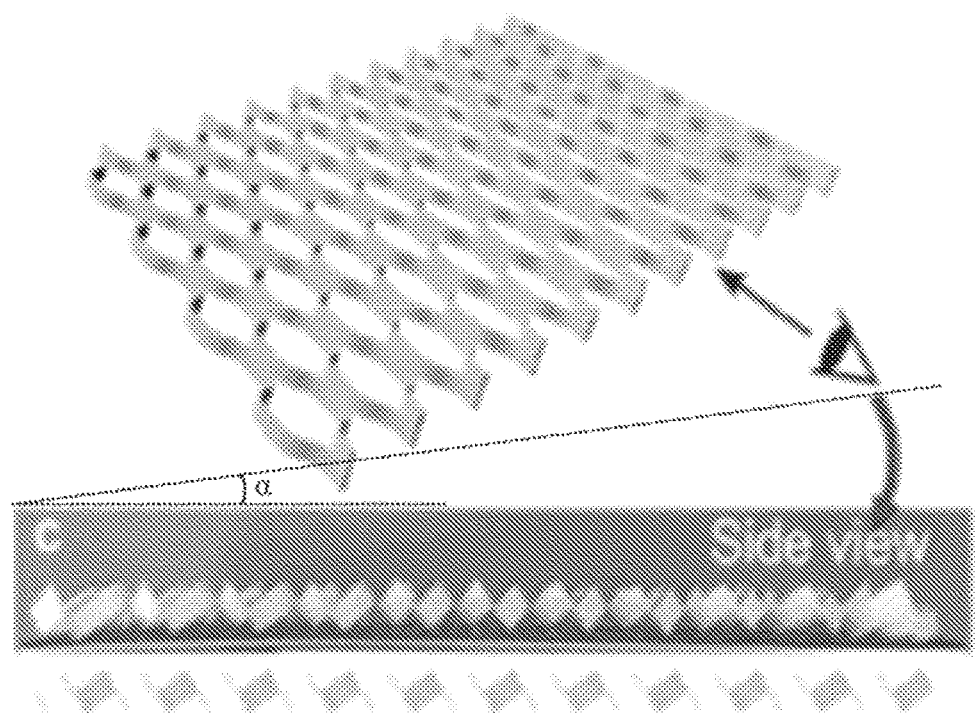
FIG. 7 is a schematic diagram showing a vertical turning angle of a display substrate after the display substrate is stretched in an exemplary embodiment of the present disclosure.

In an exemplary embodiment, the surface of the compensation layer facing the OLED pixel has an inclination angle β of 5 degrees to 10 degrees with respect to the flexible substrate 11. According to the research of inventors of the present disclosure, in a case where the stretchable display substrate can be stretched by a certain stretching amount (3% to 10%), as shown in FIG. 7, which is a schematic diagram of a vertical turning angle of the display substrate after the display substrate is stretched in an exemplary embodiment of the present disclosure, the vertical turning angle α of the display substrate is in a range of 5 degrees to 10 degrees, so that the inclination angle of the surface of the compensation layer facing the OLED pixel with respect to the flexible substrate 11 is set to 5 degrees to 10 degrees, the light emitting direction of the stretched display substrate can be maximally compensated, so that the light emitting direction of the stretched display substrate is consistent with the viewing direction, the display abnormality of the stretched display substrate is avoided, and the display performance of the stretched display substrate is improved.

In an exemplary embodiment, as shown in FIG. 4, the display substrate may include a flexible substrate 11 and a driving structure layer 13 arranged on the flexible substrate 11, and a first insulating layer 14 is arranged on the driving structure layer 13. Those skilled in the art will understand that the OLED pixel includes a first electrode 21 (usually an anode) arranged on the first insulating layer 14. The first electrode 21 is provided with a pixel defining layer 22 that defines a pixel area. In an exemplary embodiment, the compensation layer includes a first insulating layer 14, and a surface (upper surface) of the first insulating layer 14 facing the OLED pixel is an inclined surface with respect to the flexible substrate 11.

Such the first insulating layer enables the upper surface of the first electrode 21 to be inclined with respect to the flexible substrate 11, and further, when a subsequent film layer of the OLED pixel is formed, the light emitting surface of the OLED pixel is further inclined with respect to the flexible substrate 11. Therefore, when the display substrate is stretched, the OLED pixel is vertically turned over along with the display island area, and the light emitting surface of the OLED pixel is also vertically turned over to approach the horizontal state, which makes the light emitting direction of the display substrate approach the vertical direction, so that the light emitting direction is consistent with the viewing direction of a viewer, a user can clearly watch a display image of the display substrate is stretched, an optical display abnormality of the display substrate in the stretched state is avoided, and a display performance of the stretchable display substrate in the stretched state is improved.

In an exemplary embodiment, the material of the first insulating layer may include an organic material, such as at least one of resin materials such as polyimide (PI) and polyethylene terephthalate (PET). In the display substrate shown in FIG. 4, a thickness of the thickest position of the first insulating layer 14 is 2.5 μm to 3.5 μm, and the thickness of the thinnest position of the first insulating layer 14 is 0.8 μm to 1.5 μm.

Figure 8:
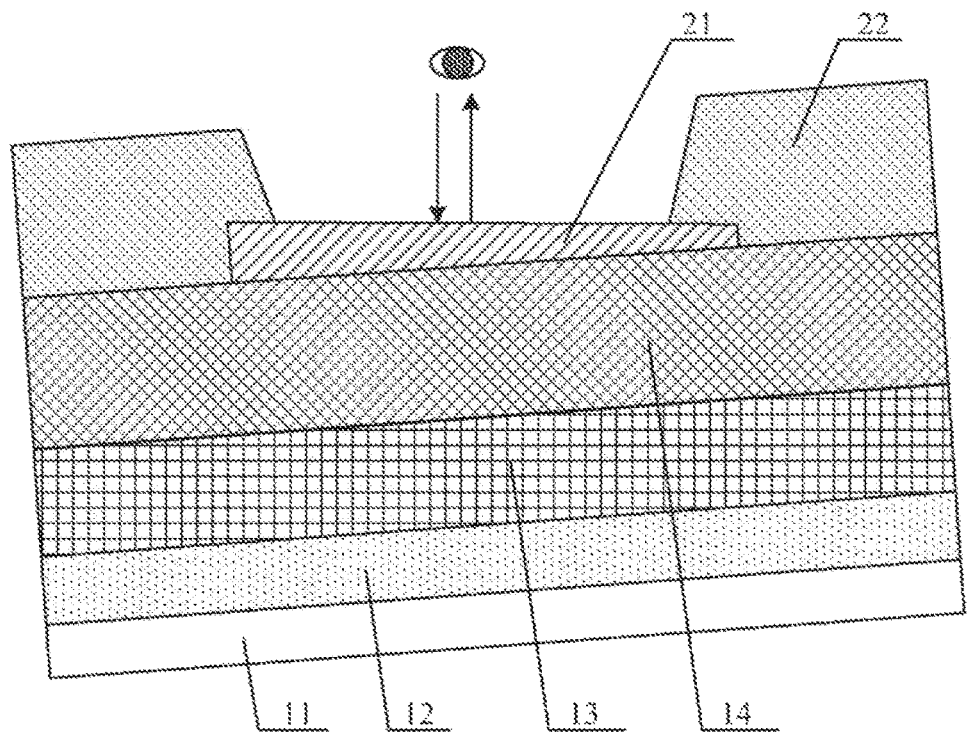
FIG. 8 is a schematic diagram of a cross-sectional structure of a display substrate after the display substrate is stretched in an exemplary embodiment.

FIG. 8 is a schematic diagram showing a cross-sectional structure of a display substrate after the display substrate is stretched in an exemplary embodiment. As shown in FIG. 8, the display substrate includes a flexible substrate 11, a buffer layer 12 arranged on the flexible substrate 11, a driving structure layer 13 arranged on the buffer layer 12, and a first insulating layer 14 arranged on the drive structure layer 13. A first electrode 21 is arranged on the first insulating layer 14, and the first electrode 21 is located in a pixel area. The first electrode 21 is provided with a pixel defining layer 22 that defines the pixel area. In the embodiment shown in FIG. 8, the compensation layer includes the first electrode 21, and the surface of the first electrode 21 facing the OLED pixel (an upper surface of the first electrode 21) is an inclined surface with respect to the flexible substrate 11. Therefore, when a subsequent film layer of the OLED pixel is formed, a light emitting surface of the OLED pixel is also inclined with respect to the flexible substrate 11. When the display substrate is stretched, the OLED pixel is vertically turned over along with the display island area, and the light emitting surface of the OLED pixels is also vertically turned over to approach the horizontal state, which makes the light emitting direction of the display substrate approach the vertical direction, so that the light emitting direction of the display substrate is consistent with the viewing direction of a viewer, a user can clearly watch a display image after the display substrate is stretched, an optical display abnormality of the display substrate in the stretched state is avoided, and a display performance of the stretchable display substrate in the stretched state is improved.

Figure 12:
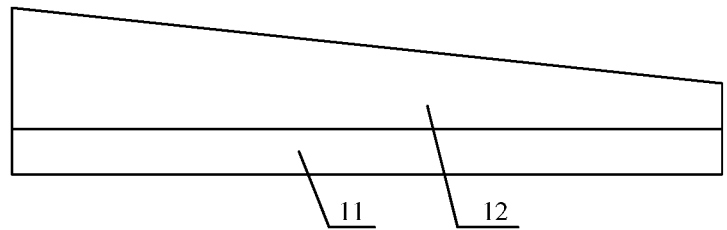
FIG. 12 is a schematic diagram of a structure of a display substrate in an exemplary embodiment of the present disclosure.

In an exemplary embodiment, the display substrate may include a flexible substrate, a buffer layer arranged on the flexible substrate, a driving structure layer arranged on the buffer layer, and a first insulating layer arranged on the driving structure layer. A first electrode is arranged on the first insulating layer, and the first electrode is located in a pixel area. The first electrode is provided with a pixel defining layer which defines the pixel area. The compensation layer includes a buffer layer, and FIG. 12 is a schematic diagram of a structure of a display substrate in an exemplary embodiment of the present disclosure. As shown in FIG. 12, the surface of the buffer layer facing the OLED pixel is an inclined surface with respect to the flexible substrate. In an exemplary embodiment, material of the buffer layer includes at least one of inorganic materials such as silicon oxide and silicon nitride.

Figure 13:
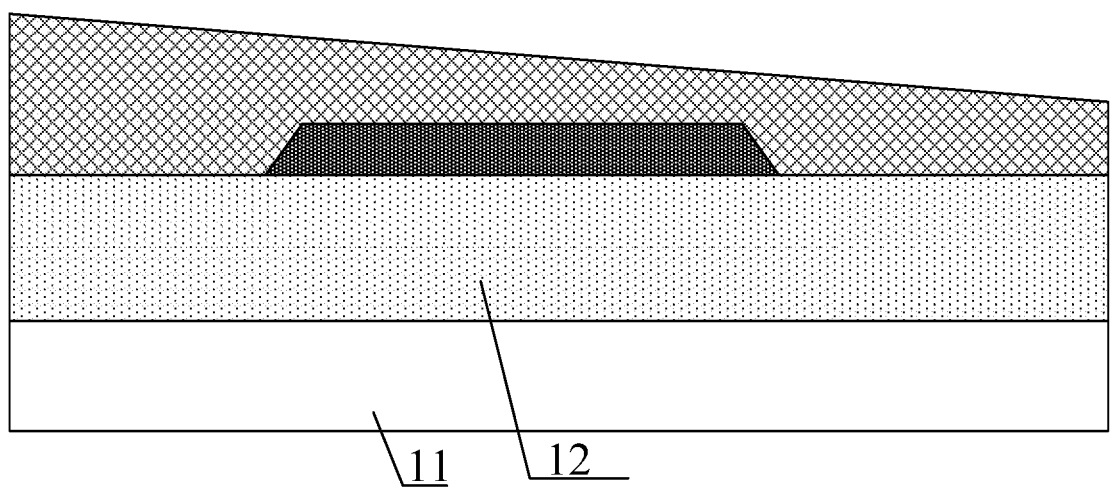
FIG. 13 is a schematic diagram of a structure of a display substrate in another exemplary embodiment of the present disclosure.
Figure 14:
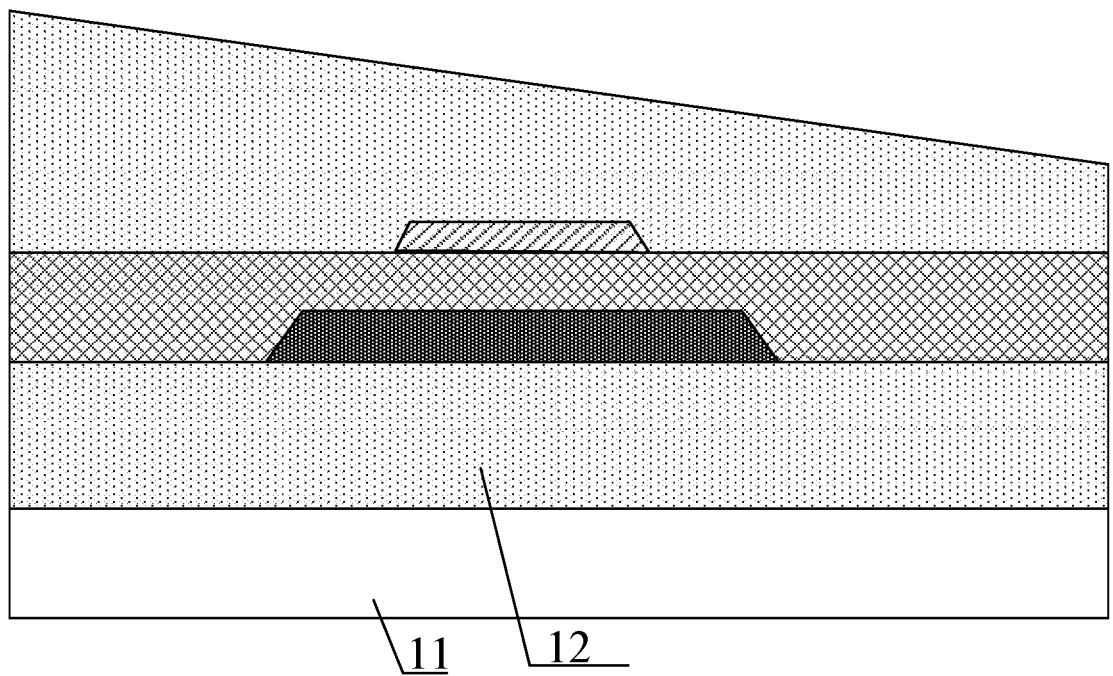
FIG. 14 is a schematic diagram of a structure of a display substrate in another exemplary embodiment of the present disclosure.

In an exemplary embodiment, the display substrate may include a flexible substrate, a driving structure layer arranged on the flexible substrate, and a first insulating layer arranged on the driving structure layer. A first electrode is arranged on the first insulating layer. The first electrode is provided with a pixel defining layer which defines a pixel area. The driving structure layer includes a thin film transistor and a second and a third insulating layers arranged between adjacent layers of the thin film transistor. For example, the driving structure layer includes an active layer arranged on the flexible substrate, a second insulating layer arranged on the active layer, a gate electrode arranged on the second insulating layer, a third insulating layer arranged on the gate electrode, and a source electrode and a drain electrode arranged on the third insulating layer. FIG. 13 is a schematic diagram of a structure of a display substrate in another exemplary embodiment of the present disclosure, as shown in FIG. 13, the compensation layer may include the second insulating layer, and the surface of the second insulating layer facing the OLED pixel is an inclined surface with respect to the flexible substrate. FIG. 14 is a schematic diagram of a structure of a display substrate in another exemplary embodiment of the present disclosure, as shown in FIG. 14, the compensation layer may include the third insulating layer, and the surface of the third insulating layer facing the OLED pixel is an inclined surface with respect to the flexible substrate.

With such a structure, after the subsequent film layer of the OLED pixel is formed, a light emitting surface of the OLED pixel is also inclined with respect to the flexible substrate. Therefore, when the display substrate is stretched, the OLED pixel is vertically turned over along with the display island area, and the light emitting surface of the OLED pixel is also vertically turned over to approach the horizontal state, which makes the light emitting direction of the display substrate approach a vertical direction, so that the light emitting direction is consistent with a viewing direction of a viewer, a user can clearly watch a display image after the display substrate is stretched, an optical display abnormality of the display substrate in the stretched state is avoided, and a display performance of the stretchable display substrate in the stretched state is improved.

In an exemplary embodiment, the thin film transistor may be a top gate type thin film transistor, so the driving structure layer may include an active layer arranged on the flexible substrate, a second insulating layer arranged on the active layer, a gate electrode arranged on the second insulating layer, a third insulating layer arranged on the gate electrode, and a source/drain electrode arranged on the third insulating layer. Those skilled in the art will understand that in another embodiment, the thin film transistor may also be a bottom gate type thin film transistor.

An embodiment of the present disclosure also provides a method for preparing a display substrate. The following is a detailed description of the method for preparing the display substrate of the embodiment of the present disclosure, taking the display substrate of the embodiment of FIG. 4 as an example.

Figure 9:
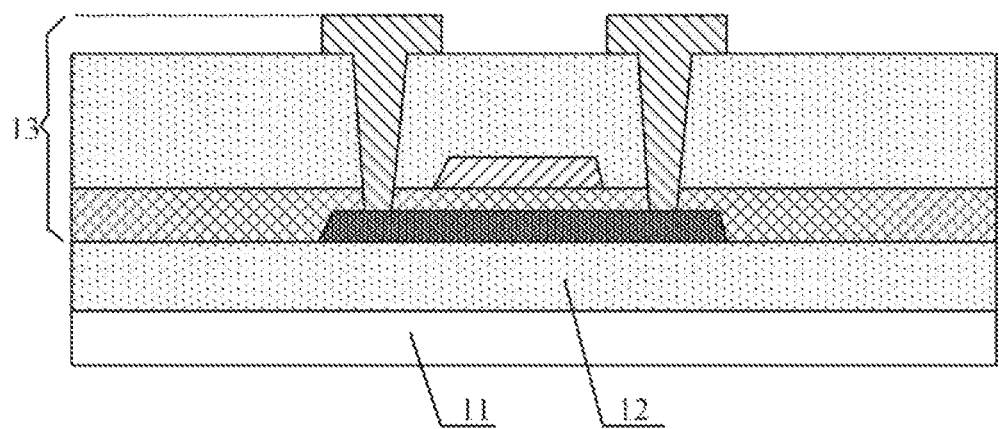
FIG. 9 is a schematic diagram of a structure of a display substrate after a driving structure layer is formed on the display substrate.

A buffer layer 12 and a driving structure layer 13 are sequentially formed on a flexible substrate 11, as shown in FIG. 9. FIG. 9 is a schematic diagram of a structure of the display substrate after the driving structure layer is formed in the display substrate. In an exemplary embodiment, the driving structure layer 13 includes a top gate type thin film transistor, and the driving structure layer includes an active layer arranged on the buffer layer 12, a second insulating layer arranged on the active layer, a gate electrode arranged on the second insulating layer, a third insulating layer arranged on the gate electrode, and a source electrode and a drain electrode arranged on the third insulating layer. The source electrode and the drain electrode are respectively electrically connected with the active layer through a via hole. Those skilled in the art will understand that in other embodiments, the thin film transistor may also be a bottom gate type thin film transistor.

Figure 10A:
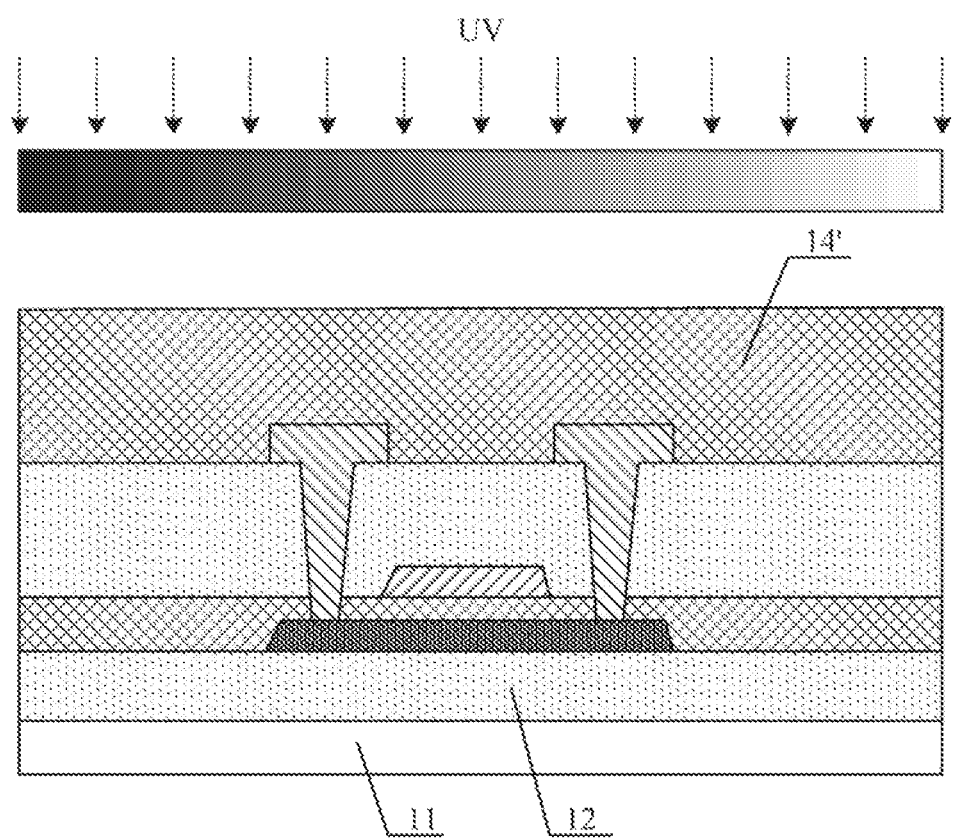
FIG. 10a is a schematic diagram of exposing a first insulating film using a gray mask.
Figure 10B:
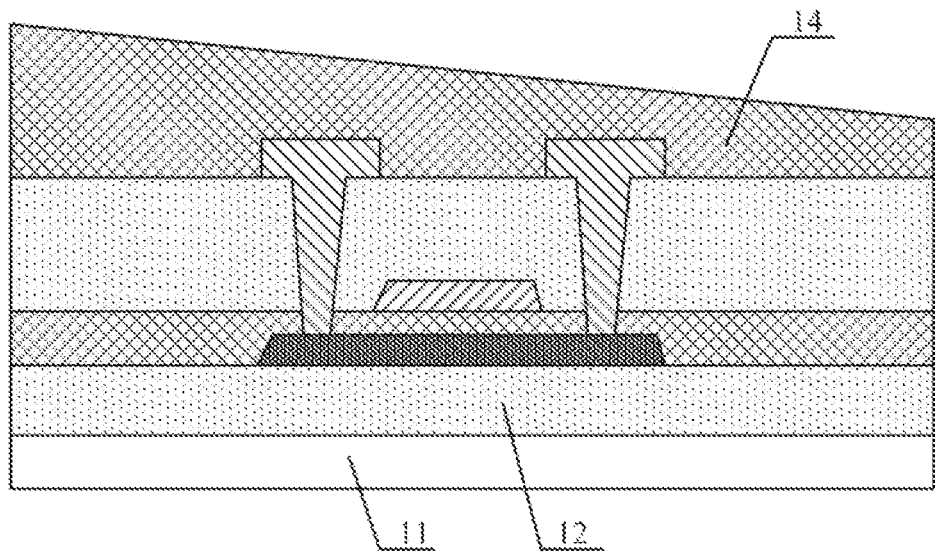
FIG. 10b is a schematic diagram of a structure of a display substrate after a first insulating layer is formed thereon.

Forming the first insulating layer 14 on the driving structure layer 13 may include: a first insulating film is coated on the driving structure layer 13; the first insulating film is exposed with a gray tone mask 15 in a pixel area, a light transmittance of the gray tone mask 15 gradually decreases, as shown in FIG. 10a. FIG. 10a is a schematic diagram of exposing the first insulating film with the gray tone mask. The exposed first organic thin film is developed to form the first insulating layer 14, and the upper surface of the first insulating layer 14 (a surface facing a direction of a first electrode 21) is inclined with respect to the flexible substrate 11, as shown in FIG. 10b, FIG. 10b is a schematic diagram of a structure of the display substrate after the first insulating layer is formed. Material of the first insulating film includes an organic material, such as at least one of resin materials such as polyimide (PI) and polyethylene terephthalate (PET).

Figure 11:
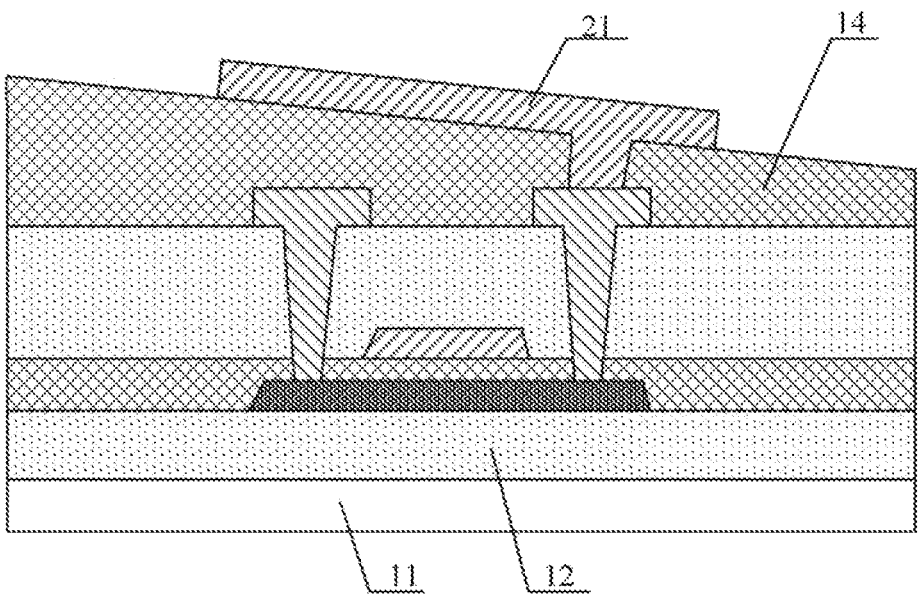
FIG. 11 is a schematic diagram of a structure of a substrate after a first electrode is formed thereon.

The first electrode 21 is formed on the first insulating layer 14. Since an upper surface of the first insulating layer 14 is inclined with respect to the flexible substrate 11, an upper surface of the formed first electrode 21 is further inclined with respect to the flexible substrate 11, as shown in FIG. 11, FIG. 11 is a schematic diagram of a structure of a display substrate after the first electrode is formed. Material of the first electrode 21 may be indium tin oxide (for example, indium tin oxide ITO).

A pixel defining layer 22 is formed on the first electrode 21, and the pixel defining layer 22 defines the pixel area as shown in FIG. 4.

Finally, other film layers of OLED pixels, such as a hole injection layer, a hole transport layer, an organic light emitting layer, an electron transport layer, an electron injection layer, a cathode, etc., are formed on the pixel defining layer 22.

According to the display substrate formed by the method, since the upper surface of the first electrode 21 is an inclined surface with respect to the flexible substrate 11, the light emitting surface of the finally formed OLED pixel is further an inclined surface with respect to the flexible substrate. When the display substrate is stretched, the OLED pixel is vertically turned over along with the display island area, and the light emitting surface of the OLED pixels is also vertically turned over to approach a horizontal state, which makes the light emitting direction of the display substrate approach a vertical direction, so that the light emitting direction is consistent with a viewing direction of a viewer, a user can clearly watch a display image after the display substrate is stretched, an optical display abnormality of the display substrate in the stretched state is avoided, and a display performance of the stretchable display substrate in the stretched state is improved.

An embodiment of the disclosure also provides a display apparatus, which includes the display substrate adopting the previous embodiment. The display device may be any product or component with a display function such as a mobile phone, a tablet computer, a television, a display, a notebook computer, a digital photo frame, a navigator, etc.

In the description of the present disclosure, it should be understood that, azimuth or positional relationships indicated by terms "middle", "upper", "lower", "front", "rear", "vertical", "horizontal", "top", "bottom", "inner", "outer" and the like is based on the azimuth or positional relationship shown in the drawings, which is only for ease of description of the present disclosure and simplification of the description, rather than indicating or implying that the device or element referred to must have a specific orientation, or must be constructed and operated in a particular orientation, and therefore cannot be construed as limiting the present disclosure.

In the description of embodiments of the present disclosure, it is to be noted that the terms "install", "connect" and "link" shall be broadly understood unless otherwise explicitly specified and defined, for example, they may be fixed connection, removable connection or integral connection; or they may be mechanical connection or electrical connection; or they may be directly connected, or indirectly connected through an intermediate medium, or the communication between the two components. Those of ordinary skilled in the art can understand the specific meanings of the above terms in the present disclosure according to specific situations.

Although the embodiments disclosed in the present disclosure are as the above, the contents are only embodiments for facilitating understanding the present disclosure and are not used to limit the present disclosure. Any person skilled in the field to which the present disclosure pertains can make any modifications and variations in the forms and details of implementation without departing from the spirit and the scope disclosed in the present disclosure, but the patent protection scope of the present disclosure should still be subject to the scope defined by the appended claims.

What we claim is:

1. A display substrate, comprising:
a flexible substrate and a driving structure layer arranged on the flexible substrate, and a first insulating layer arranged on the driving structure layer,
wherein an Organic Light-Emitting Diode (OLED) pixel is arranged on the first insulating layer, the driving structure layer comprises an active layer arranged on the flexible substrate, a second insulating layer arranged on the active layer, a gate electrode arranged on the second insulating layer, a third insulating layer arranged on the gate electrode, and a source electrode and a drain electrode arranged on the third insulating layer;
wherein the display substrate further comprises a buffer layer arranged on the flexible substrate, the driving structure layer is arranged on the buffer layer, and
wherein a whole surface of the buffer layer facing the OLED pixel is an inclined surface with respect to the flexible substrate.

2. The display substrate according to claim 1, wherein a surface of the first insulating layer facing the OLED pixel is an inclined surface with respect to the flexible substrate, and an angle between a surface of the first insulating layer facing the OLED pixel and the flexible substrate is 5 degrees to 10 degrees.

3. The display substrate according to claim 1, wherein the OLED pixel comprises a first electrode arranged on the first insulating layer.

4. The display substrate according to claim 3, wherein material of the first insulating layer is an organic material.

5. The display substrate according to claim 3, wherein a thickness of the thickest position of the first insulating layer is 2.5 μm to 3.5 μm, and a thickness of the thinnest position of the first insulating layer is 0.8 μm to 1.5 μm.

6. The display substrate according to claim 2, wherein the OLED pixel comprises a first electrode arranged on the first insulating layer.

7. The display substrate according to claim 6, wherein the material of the first insulating layer is an organic material.

8. The display substrate according to claim 6, wherein a thickness of the thickest position of the first insulating layer is 2.5 μm to 3.5 μm, and a thickness of the thinnest position of the first insulating layer is 0.8 μm to 1.5 μm.

9. The display substrate according to claim 1, wherein the first insulating layer comprises a first electrode, and a surface of the first electrode facing the OLED pixel is an inclined surface with respect to the flexible substrate.

10. The display substrate according to claim 2, wherein the first insulating layer comprises a first electrode, and a surface of the first electrode facing the OLED pixel is an inclined surface with respect to the flexible substrate.

11. A method for preparing a display substrate panel, comprising:
    forming a buffer layer on a flexible substrate;
    forming a driving structure layer on the buffer layer;
    forming a first insulating film on the driving structure layer;
    exposing and developing the first insulating film by adopting a gray tone mask plate to form a first insulating layer; and
    forming the OLED pixel on the first insulating layer,
    wherein the driving structure layer comprises an active layer arranged on the flexible substrate, a second insulating layer arranged on the active layer, a gate electrode arranged on the second insulating layer, a third insulating layer arranged on the gate electrode, and a source electrode and a drain electrode arranged on the third insulating layer;
    wherein a whole surface of the buffer layer facing the OLED pixel is an inclined surface with respect to the flexible substrate.

12. A display apparatus, comprising a display substrate, wherein
    the display substrate comprises
    a flexible substrate and a driving structure layer arranged on the flexible substrate, and a first insulating layer arranged on the driving structure layer,
    wherein an Organic Light-Emitting Diode (OLED) pixel is arranged on the first insulating layer, the driving structure layer comprises an active layer arranged on the flexible substrate, a second insulating layer arranged on the active layer, a gate electrode arranged on the second insulating layer, a third insulating layer arranged on the gate electrode, and a source electrode and a drain electrode arranged on the third insulating layer;
    wherein the display substrate further comprises a buffer layer arranged on the flexible substrate, the driving structure layer is arranged on the buffer layer; and
    wherein a whole surface of the buffer layer facing the OLED pixel is an inclined surface with respect to the flexible substrate.

13. The display apparatus according to claim 12, wherein an angle between a surface of the first insulating layer facing the OLED pixel and the flexible substrate is 5 degrees to 10 degrees.

14. The display apparatus according to claim 12, wherein the OLED pixel comprises a first electrode arranged on the first insulating layer.

* * * * *